United States Patent
Kim et al.

(10) Patent No.: US 10,679,955 B2
(45) Date of Patent: Jun. 9, 2020

(54) SEMICONDUCTOR PACKAGE WITH HEAT-DISSIPATING STRUCTURE AND METHOD OF MANUFACTURING THE SAME

(71) Applicant: SAMSUNG ELECTRO-MECHANICS CO., LTD., Suwon-si (KR)

(72) Inventors: Tae Hyun Kim, Suwon-si (KR); Thomas A. Kim, Suwon-si (KR); Kyu Bum Han, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/788,189

(22) Filed: Oct. 19, 2017

(65) Prior Publication Data

US 2018/0197831 A1 Jul. 12, 2018

(30) Foreign Application Priority Data

Jan. 11, 2017 (KR) .......................... 10-2017-0004245

(51) Int. Cl.
*H01L 23/367* (2006.01)
*H01L 23/13* (2006.01)
(Continued)

(52) U.S. Cl.
CPC .............. *H01L 24/06* (2013.01); *H01L 23/13* (2013.01); *H01L 23/3675* (2013.01); *H01L 23/3677* (2013.01); *H01L 23/5389* (2013.01); *H01L 23/552* (2013.01); *H01L 24/09* (2013.01); *H01L 24/14* (2013.01); *H01L 24/17* (2013.01); *H01L 24/19* (2013.01); *H01L 24/97* (2013.01); *H01L 25/105* (2013.01); *H01L 23/49816* (2013.01); *H01L 23/49827* (2013.01); *H01L 23/5386* (2013.01); *H01L 25/03* (2013.01); *H01L 2224/02311* (2013.01); *H01L 2224/02319* (2013.01); *H01L 2224/02373* (2013.01); *H01L 2224/02379* (2013.01); *H01L 2224/04105* (2013.01); *H01L 2224/0603* (2013.01);
(Continued)

(58) Field of Classification Search
CPC ..... H01L 23/49827; H01L 2225/06589; H01L 23/367; H01L 2225/1094; H01L 2224/06519
See application file for complete search history.

(56) References Cited

U.S. PATENT DOCUMENTS 8,664,764 B2 * 3/2014 Horiuchi .............. H01L 23/5389 257/698
9,609,741 B1 * 3/2017 Noguchi .............. H05K 1/0203
(Continued)

FOREIGN PATENT DOCUMENTS

| JP | 2008-159819 A | 7/2008 |
|---|---|---|
| KR | 10-2009-0124064 A | 12/2009 |
| KR | 10-2015-0079189 A | 7/2015 |

*Primary Examiner* — Stephen M Bradley
(74) *Attorney, Agent, or Firm* — NSIP Law

(57) ABSTRACT

A semiconductor package includes a substrate portion including a core layer having a device accommodating portion formed therein, and a buildup layer stacked on each of opposing sides of the core layer; an electronic device disposed in the device accommodating portion; and heat dissipating conductors disposed in the buildup layer to externally emit heat generated by the electronic device.

14 Claims, 9 Drawing Sheets

(51) Int. Cl.
*H01L 23/498* (2006.01)
*H01L 23/00* (2006.01)
*H01L 23/538* (2006.01)
*H01L 25/10* (2006.01)
*H01L 23/552* (2006.01)
*H01L 25/03* (2006.01)

(52) U.S. Cl.
CPC ............ *H01L 2224/06131* (2013.01); *H01L 2224/06136* (2013.01); *H01L 2224/06151* (2013.01); *H01L 2224/06155* (2013.01); *H01L 2224/06159* (2013.01); *H01L 2224/06177* (2013.01); *H01L 2224/06181* (2013.01); *H01L 2224/06182* (2013.01); *H01L 2224/06519* (2013.01); *H01L 2224/09181* (2013.01); *H01L 2224/09519* (2013.01); *H01L 2224/12105* (2013.01); *H01L 2224/1403* (2013.01); *H01L 2224/14131* (2013.01); *H01L 2224/14136* (2013.01); *H01L 2224/14151* (2013.01); *H01L 2224/14155* (2013.01); *H01L 2224/14177* (2013.01); *H01L 2224/16227* (2013.01); *H01L 2224/17519* (2013.01); *H01L 2224/2518* (2013.01); *H01L 2224/96* (2013.01); *H01L 2225/1035* (2013.01); *H01L 2225/1058* (2013.01); *H01L 2225/1094* (2013.01); *H01L 2924/15311* (2013.01); *H01L 2924/3025* (2013.01)

(56) References Cited

U.S. PATENT DOCUMENTS

| | | | | |
|---|---|---|---|---|
| 2006/0091290 A1* | 5/2006 | Yoshihara | ......... | H01L 27/14618 250/208.1 |
| 2006/0110859 A1* | 5/2006 | Shigemura | .......... | H01L 23/3121 438/125 |
| 2006/0145328 A1* | 7/2006 | Hsu | ..................... | H01L 23/5389 257/690 |
| 2008/0211086 A1 | 9/2008 | Morita | | |
| 2009/0072384 A1* | 3/2009 | Wong | ................. | H01L 23/3677 257/712 |
| 2011/0169042 A1* | 7/2011 | Wu | ....................... | H01L 33/642 257/99 |
| 2012/0326325 A1* | 12/2012 | Choi | .................... | H01L 21/561 257/774 |
| 2013/0037936 A1* | 2/2013 | Choi | .................... | H01L 21/561 257/737 |
| 2013/0277821 A1* | 10/2013 | Lundberg | ................ | H01L 23/34 257/713 |
| 2014/0041907 A1* | 2/2014 | Kim | ..................... | H05K 1/0204 174/252 |
| 2014/0138836 A1* | 5/2014 | Nagasawa | ........... | H01L 23/3677 257/766 |
| 2014/0252645 A1* | 9/2014 | Kim | ....................... | H01L 23/34 257/774 |
| 2014/0307394 A1* | 10/2014 | Lobianco | ............. | H04B 1/3838 361/728 |
| 2015/0028448 A1* | 1/2015 | Hosseini | ............. | H01L 23/5389 257/531 |
| 2015/0115443 A1* | 4/2015 | Oh | ....................... | H01L 23/3135 257/738 |
| 2015/0189757 A1 | 7/2015 | Kim et al. | | |
| 2015/0351218 A1* | 12/2015 | Munakata | ............ | H05K 1/0206 361/761 |
| 2015/0371936 A1* | 12/2015 | Chen | .................. | H01L 23/5384 257/774 |
| 2016/0133613 A1* | 5/2016 | Seo | ........................ | H01L 25/105 257/686 |
| 2017/0005023 A1* | 1/2017 | Chen | ...................... | H01L 22/14 |
| 2017/0154878 A1* | 6/2017 | Kim | ...................... | H01L 25/105 |
| 2017/0207140 A1* | 7/2017 | Yasutake | ............. | H01L 21/4853 |
| 2017/0309541 A1* | 10/2017 | Kim | ...................... | H01L 23/3675 |
| 2017/0365581 A1* | 12/2017 | Yu | ........................ | H01L 25/0655 |
| 2018/0019221 A1* | 1/2018 | Appelt | .................. | H01L 21/486 |
| 2018/0151392 A1* | 5/2018 | Chew | ................... | H01L 21/568 |

\* cited by examiner

US 10,679,955 B2

SEMICONDUCTOR PACKAGE WITH HEAT-DISSIPATING STRUCTURE AND METHOD OF MANUFACTURING THE SAME

CROSS-REFERENCE TO RELATED APPLICATION(S)

This application claims the benefit under 35 USC 119(a) of Korean Patent Application No. 10-2017-0004245 filed on Jan. 11, 2017 in the Korean Intellectual Property Office, the entire disclosure of which is incorporated herein by reference for all purposes.

BACKGROUND

1. Field

The following description relates to a semiconductor package and a method of manufacturing the same.

2. Description of Related Art

A major trend in the recent technological development of semiconductor chips is to reduce the size of components. Therefore, in the area of packaging, it has been necessary to implement a plurality of pins having a small size due to a surge in demand for small semiconductor chips.

One package technology proposed, in line with this trend, is a fan-out semiconductor package. Such a fan-out semiconductor package allows a connection terminal to be redistributed even outwardly of a region in which a semiconductor chip is disposed, thereby implementing a plurality of pins having a small size.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. In one general aspect, a semiconductor package, includes a substrate portion including a core layer having a device accommodating portion formed therein, and a buildup layer stacked on each of opposing sides of the core layer; an electronic device disposed in the device accommodating portion; and heat dissipating conductors disposed in the buildup layer to externally emit heat generated by the electronic device.

The electronic device may have an active surface having a terminal formed therein and an inactive surface opposite to the active surface. The heat dissipating conductor may be connected to the inactive surface.

The semiconductor package may further include an insulating protective layer disposed in the buildup layer. The insulating protective layer may comprise openings partially exposing the heat dissipating conductors.

One of the heat dissipating conductors may be disposed opposite to the inactive surface of the electronic device.

The heat dissipating conductors may include heat dissipating pads, a region exposed externally through the insulating protective layer, and a total area of the heat dissipating pads being 35.5% or less of an area of the inactive surface of the electronic device.

The heat dissipating conductors may be formed to allow a ratio D/P to be 67 or more, where D is a diameter of a heat dissipating pad of the heat dissipating pads and P is a separation distance between the heat dissipating pads.

The heat dissipating conductors may be disposed in a lattice form.

A heat dissipating conductor of the heat dissipating conductors may be disposed to pass through an insulating layer forming the buildup layer, one end of the heat dissipating conductor being connected to the electronic device, and the other end thereof being exposed externally through the buildup layer.

The electronic device may be disposed in the device accommodating portion in a bare die state.

In another general aspect, a semiconductor package includes a first package comprising a core layer having an electronic device embedded therein, a buildup layer stacked on each of opposing sides of the core layer, and heat dissipating conductors disposed in the buildup layer to externally emit heat generated by the electronic device; and a second package mounted on the first package.

The semiconductor package may further include a metal layer formed on surfaces of the first package and the second package to shield electromagnetic waves.

In another general aspect, a method of manufacturing a semiconductor package includes forming a device accommodating portion in the form of a through-hole in a core layer; disposing an electronic device in the device accommodating portion; and forming a buildup layer on each of opposing sides of the core layer. The buildup layer includes an insulating layer and a distribution layer. The buildup layer comprises forming an heat dissipating conductor passing through the insulating layer to connect one end of the heat dissipating conductor to the electronic device and externally exposing the other end of the buildup layer.

The semiconductor package may further include completing a first package by forming an insulating protective layer on the buildup layer, after the forming a buildup layer.

The semiconductor package may further include mounting a second package, separately manufactured, on one surface of the first package.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
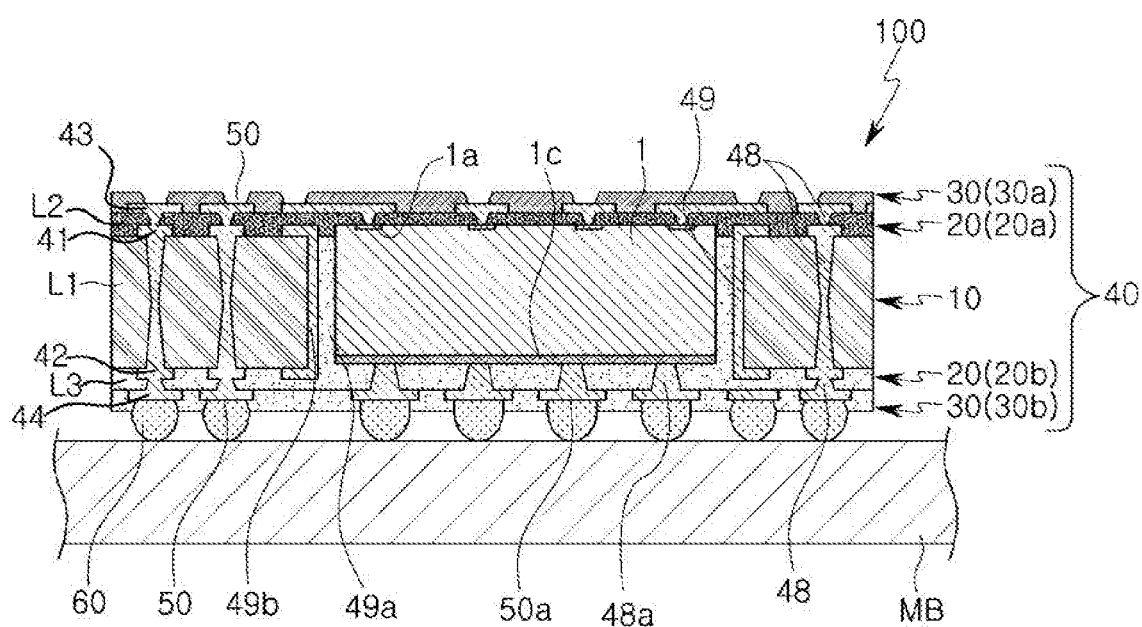
FIG. 1 is a cross-sectional view schematically illustrating an example of a semiconductor package.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
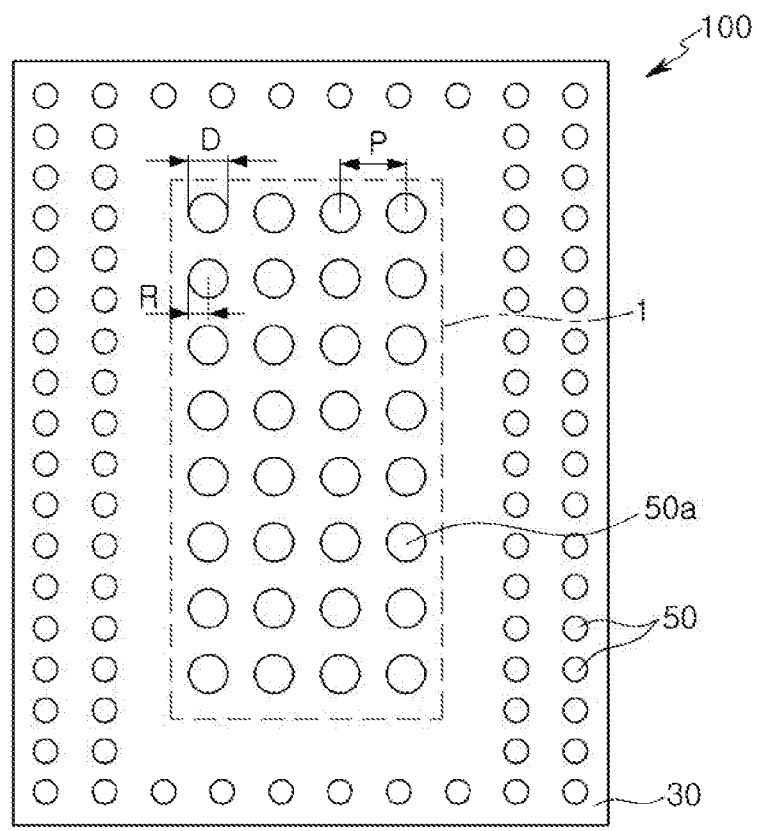
FIG. 2 is a bottom view illustrating the semiconductor package of FIG. 1.

FIG. 1 is a cross-sectional view schematically illustrating an example of a semiconductor package, and FIG. 2 is a bottom view illustrating the semiconductor package of FIG. 1.

Referring to FIGS. 1 and 2, a semiconductor package 100 according to an example includes substrate portions 10, 20, and 30, as well as at least one electronic device 1 embedded in the substrate portions 10, 20, and 30.

In the substrate portions 10, 20, and 30, a plurality of insulating layers L1 to L3 and distribution layers 41 to 44 are repeatedly stacked, and a device accommodating portion 49 is provided therein.

In addition, the substrate portions 10, 20, and 30 define a core layer 10, a buildup layer 20 stacked on an outside of the core layer 10, and an insulating protective layer 30 stacked on an outside of the buildup layer 20, respectively.

The insulating layers L1 to L3 of the substrate portions 10, 20, and 30 may be formed of a material having insulating properties. For example, a material of the insulating layers L1 to L3 may be a thermosetting resin such as an epoxy resin, a thermoplastic resin such as polyimide, or a resin in which the resin described above is impregnated with a core material such as a glass cloth with an inorganic filler like prepreg, an ajinomoto build-up film (ABF), FR-4, bismaleimide triazine (BT), or the like. If required, a photo imageable dielectric (PID) resin may be used, but an example is not limited thereto.

The insulating layer L1 of the core layer 10 and the insulating layers L2 and L3 of the buildup layer 20 may be formed of different materials, or may be formed partially of the same materials. For example, the insulating layer L1 of the core layer 10 may be formed of a polymer material, and the insulating layers L2 and L3 of the buildup layer 20 may be formed of an epoxy material, or may be formed in an opposing manner. In addition, as required, various modifications are possible. For example, the insulating layers L1 to L3 of the substrate portions 10, 20, and 30 may be formed of the same material.

The distribution layers 41 to 44 are disposed in one or both sides of each of the insulating layers L1 to L3.

The distribution layers 41 to 44 may be formed of a conductive material, for example, copper (Cu), aluminum (Al), silver (Ag), tin (Sn), gold (Au), nickel (Ni), lead (Pb), titanium (Ti), or alloys thereof.

Respective portions of the distribution layers 43 and 44 of the distribution layers 41 to 44, disposed in the outermost position, are exposed through openings of the insulating protective layer 30, and thus function as a connection pad 50.

In addition, interlayer connection conductors 48 are disposed in the insulating layers L1 to L3 while passing through the insulating layers L1 to L3. An interlayer connection conductor 48 allows connection pads 50 or the distribution layers 41 to 44 to be electrically connected to each other.

The interlayer connection conductor 48 may be formed of a conductive material such as Cu, Al, Ag, Sn, Au, Ni, Pb, Ti, or alloys thereof. The interlayer connection conductor 48 may be formed as a conductive pillar with which an interior of a via hole is completely filled, or may have the form in which a conductive material is applied to an inner wall of a via hole. In addition, any shape known in the art, such as a horn shape, a column shape, and the like, may be applied.

The distribution layers 41 to 44 and the interlayer connection conductor 48 may be formed using a photolithography method. For example, the distribution layers 41 to 44 may be formed by patterning a metal layer such as a Cu foil. In addition, the interlayer connection conductor 48 may be formed by filling an interior of a via hole with a conductive material, after the via hole is formed in the insulating layers L1 to L3, but an example is not limited thereto.

The core layer 10 is disposed in the center of a substrate portion 40 and is formed of a single layer, but an example is not limited thereto. As required, the core layer may be formed as a multilayer structure.

The device accommodating portion 49 in which the electronic device 1 is embedded is formed in the substrate portion 40.

The device accommodating portion 49 is formed in the core layer 10. However, as required, the device accommodating portion may be partially extended to the buildup layer 20.

An insulating member 49a is disposed in the device accommodating portion 49. The insulating member 49a fills the space in the device accommodating portion 49, between the electronic device 1 and the core layer 10, after the electronic device 10 is disposed in the device accommodating portion 49.

The insulating member 49a is formed of a material having insulating properties that easily fills the device accommodating portion 49, such as an epoxy resin. For example, the insulating member 49a is formed as a semi-cured resin or polymer that fills the device accommodating portion 49, and is then cured, but an example is not limited thereto.

The electronic device 1 embedded in the device accommodating portion 49 may be a device that generates a relative large amount of heat during operation. For example, the electronic device 1 may be a power amplifier. As long as a device generates a relatively large amount of heat and is embedded in a substrate, it is applicable to the disclosed examples.

In an example, a case in which only a single electronic device 1 is accommodated in the device accommodating portion 49 is illustrated, but the example is not limited thereto. As required, a plurality of electronic devices may be disposed therein.

In addition, the electronic device 1 according to an example is accommodated in in the device accommodating portion 49 as a bare die or a bare chip cut from a wafer. Thus, an overall size of the semiconductor package 100 is significantly reduced.

The electronic device 1 has an active surface in which a terminal 1a is formed, and an inactive surface opposite to the active surface. In addition, a conductor layer 1c is provided in the inactive surface of the electronic device 1.

The buildup layer 20 serves to redistribute the terminal is of the electronic device 1, and is formed in a build-up method on the core layer 10.

A plurality of terminals having various functions may be redistributed through the buildup layer 20, and may be physically and/or electrically connected externally in accordance with a function thereof through an external connection terminal 60.

The insulating layers L2 and L3 forming the buildup layer 20 may be formed of the same material, but may be formed of different materials as required.

For example, the insulating layers L2 and L3 forming the buildup layer 20 may be formed of a photosensitive insulating material such as a PID resin in addition to the insulating material described above. In this case, the insulating layers L2 and L3 are formed to be thinner, and a fine line width is implemented.

The buildup layer 20 includes a first redistribution layer 20a and a second redistribution layer 20b. The first redistribution layer 20a refers to a buildup layer 20 formed on the active surface of the electronic device 1, and the second redistribution layer 20b refers to a buildup layer 20 formed on the inactive surface of the electronic device 1.

The buildup layer 20 allows the distribution layers 41 and 42, formed in the core layer 10, to be electrically connected to the connection pads 50.

In addition, the distribution layer 43 formed in the first redistribution layer 20a allows terminals 1a disposed on the active surface of the electronic device 1 to be electrically connected to the connection pads 50. Moreover, the distribution layer 44 formed in the second redistribution layer 20b allows the conductor layer 1c formed on the inactive surface of the electronic device 1 to be electrically connected to the connection pads 50.

The thickness of the buildup layer 20 is formed to be thinner than the thickness of the core layer 10. The thickness of the core layer 10 is formed to be thicker than the thickness of the electronic device 1. On the other hand, the buildup layer 20 may be formed to be relatively thin, as compared to the core layer 10, for the purpose of thinning.

The insulating protective layer 30 is an additional configuration for protecting the buildup layer 20 from an external environment. The insulating protective layer 30 is disposed outside of the buildup layer 20. Thus, the insulating protective layer 30 is disposed in the outermost position of the semiconductor package 100, and thus forms a surface of the semiconductor package 100.

In addition, the insulating protective layer 30 has a plurality of openings externally exposing the connection pad 50. A heat dissipating conductor 48a, to be described later, is exposed through an opening, in the form of a heat dissipating pad.

The insulating protective layer 30 is divided into a first insulating protective layer 30a formed on the first redistribution layer 20a and a second insulating protective layer 30b formed on the second redistribution layer 20b, depending on a position in which the insulating protective layer is disposed.

A material of the insulating protective layer 30 is not particularly limited, and may be, for example, a photosensitive insulating material such as a photosensitive insulating resin, a solder resist, or the like.

The interlayer connection conductor 48 according to an example includes at least one heat dissipating conductor 48a.

The heat dissipating conductor 48a is disposed on the inactive surface of the electronic device 1, in detail, in the second redistribution layer 20b. Thus, a thickness of the heat dissipating conductor 48a is the same as or similar to a thickness of the insulating layer L3 of the second redistribution layer 20b.

The heat dissipating conductor 48a is disposed to pass through the insulating layer L3 with one end connected to the conductor layer 1c disposed on the inactive surface of the electronic device 1.

The other end of the heat dissipating conductor 48a is connected to the distribution layer 44 of the second redistribution layer 20b. The distribution layer 44 connected to the heat dissipating conductor 48a is externally exposed through the semiconductor package 100 through an opening in the insulating protective layer 30b, in the form of a pad (hereinafter, a heat dissipating pad).

Thus, a heat dissipating pad 50a is a pad exposed through an opening of the insulating protective layer 30b as the heat dissipating conductor 48a is extended through the distribution layer 44.

However, an example is not limited thereto, and the other end of the heat dissipating conductor 48a may be directly exposed through an opening of the insulating protective layer 30b. In this case, the other end of the heat dissipating conductor 48a will serve as the heat dissipating pad 50a.

The heat dissipating conductor 48a is formed by filling a via hole with a conductive material using a method such as plating after the via hole is formed in the insulating layer L3 using a process such as exposure, etching, or the like. Thus, the heat dissipating conductor 48a is provided in the form corresponding to that of a via hole.

In an example, the heat dissipating conductor 48a is disposed in a position opposed to the electronic device 1. Thus, all heat dissipating conductors 48a are located in a region opposed to the inactive surface of the electronic device 1.

In addition, a plurality of heat dissipating conductors 48a are disposed in lattice form. Thus, the plurality of heat dissipating conductors 48a are disposed to be spaced apart from each other by the same separation distance P. Here, the separation distance P (a pitch) refers to a distance between the centers of two heat dissipating pads 50a, adjacent to each other.

The heat dissipating conductor 48a according to an example is externally exposed through a bottom surface of the semiconductor package 100, in the form of the heat dissipating pad 50a. The heat dissipating pad 50a serves as a connection pad. For example, the external connection terminal 60 may be bonded thereto. In addition, as required, a heat dissipation member (not shown) such as a heat sink may be embedded therein.

As illustrated in FIG. 1, when the heat dissipating pad 50a is connected to a main substrate MB through external connection terminals 60, heat generated by the electronic device 1 in the device accommodating portion 49 is efficiently emitted.

However, when a relatively large number of heat dissipating conductors 48a are disposed, manufacturing becomes more complex but when a relatively small number of heat dissipating conductors are disposed, the heat dissipating efficiency is reduced.

Thus, in order to easily manufacture the semiconductor package 100 while increasing a heat dissipation efficiency, it is necessary to adequately define the size of the heat dissipating conductor 48a and a distance between the heat dissipating conductors 48a.

The present applicant performs thermal analysis depending on a diameter of the heat dissipating pad 50a and the distance between heat dissipating pads 50a. Thus, conditions needed for optimizing heat dissipation properties while optimizing a process yield are derived and described below.

Figure 7:
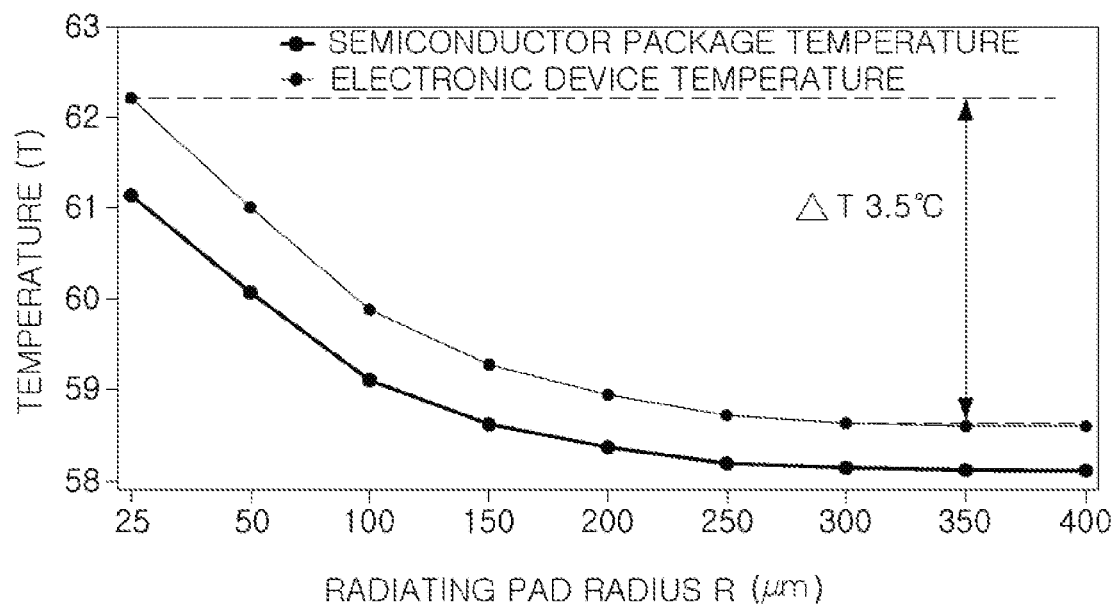
FIG. 7 is a graph illustrating a temperature change of a semiconductor package due to a change in radius of a heat dissipating pad.
Figure 8:
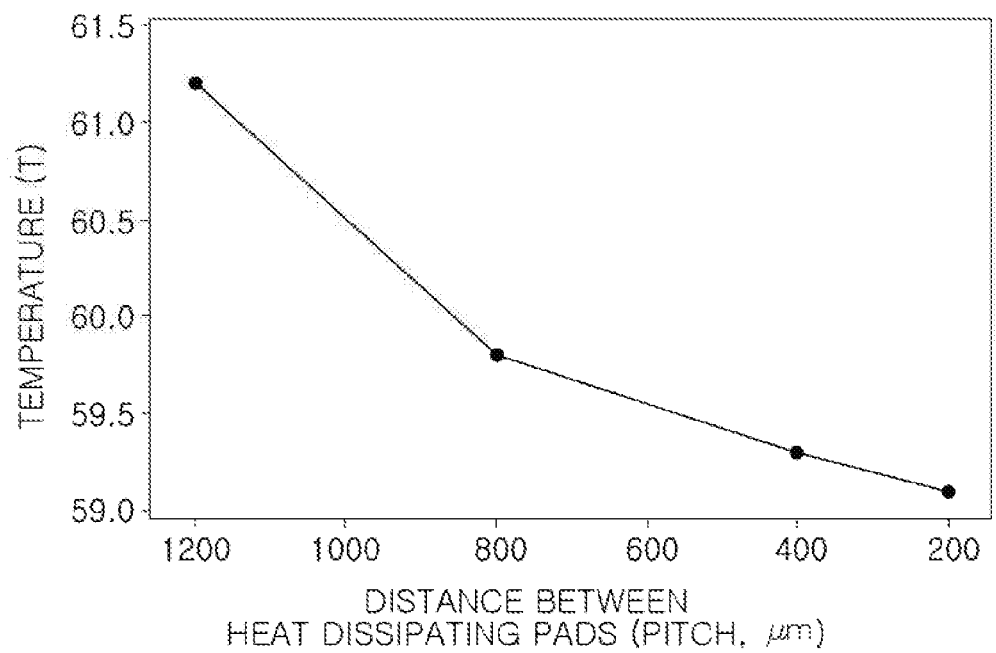
FIG. 8 is a graph illustrating a temperature change of a semiconductor package due to a change in distance between heat dissipating pads.

FIG. 7 is a graph illustrating a temperature change of a semiconductor package due to a change in radius of a heat dissipating pad, and FIG. 8 is a graph illustrating a temperature change of a semiconductor package due to a change in distance between heat dissipating pads.

First, a distance between the heat dissipating pads 50a (P of FIG. 2, hereinafter, a pitch) is defined as 0.8 mm, and a temperature change of a semiconductor package due to a change in a radius R of the heat dissipating pad 50a is measured. As a result, as illustrated in FIG. 7, as a radius R of the heat dissipating pad 50a is increased, it is confirmed that the temperature is reduced as an exponential function. In addition, when the radius R of the heat dissipating pad 50a is increased up to 250 μm, the temperature rapidly decreases in proportion thereto. However, when a radius of the heat dissipating pad 50a is increased past 250 μm, the measured temperature of the semiconductor package approaches saturation and decreases slowly.

When the radius R of the heat dissipating pad 50a is 250 μm, the total area (hereinafter, an area ratio of a heat dissipating pad) of the heat dissipating pad 50a with respect to the area of the inactive surface of the electronic device 1 is around 35.5%. Thus, when an area ratio of the heat dissipating pad is 35.5% or more, it is confirmed that the temperature reduction is insignificant and a point of diminishing return is reached.

In addition, FIG. 8 is a graph in which the diameter D of the heat dissipating pad 50a is fixed at 200 μm, and a temperature change due to a change in the pitch P is measured by simulation. Here, it is confirmed that as the pitch P reduces, the temperature nonlinearly reduces.

In addition, the temperature was measured as the temperature gradient decreases from the pitch P of 800 μm or less. In a section in which the pitch P is 400 μm or less, it is confirmed that the temperature is reduced with the gradient of 0.0005° C./mm. Thus, it is confirmed that the temperature of the semiconductor package 100 is efficiently reduced, when the pitch P is set to 400 μm or more.

When the pitch P is set to 400 μm, the area ratio of the heat dissipating pad 50a is 22%. When the pitch P is set to 300 μm, the area ratio of the heat dissipating pad 50a is about 37.5%. In FIG. 7, when the area ratio of the heat dissipating pad 50a is 35.5% or more, it is confirmed that the temperature reduction amount is not significant. Thus, when the pitch P is set to 300 μm or less, the area ratio of the heat dissipating pad 50a increases, but the temperature reduction efficiency is not significant.

Thus, when the pitch P is set to 300 μm and the diameter D of the heat dissipating pad 50a is set to 200 μm, it is confirmed that the temperature is significantly reduced. In this case, the ratio D/P of the diameter D of the heat dissipating pad 50a to the pitch P is about 67(%). When the ratio D/P is 67 or less, as can be confirmed, the slope of the curve is minimal and the temperature reduction rate is significantly lower.

As the diameter D of the heat dissipating pad 50a increases and the pitch P reduces, the temperature reduction efficiency of the semiconductor package 100 increases. Thus, it is confirmed that, when the ratio D/P of the diameter D of the heat dissipating pad 50a with respect to the pitch P is greater than 67, the temperature of the semiconductor package 100 is efficiently lowered. Here, an area ratio of the heat dissipating pad 50a is configured to be 35.5% or less.

Thus, in order to easily manufacture a semiconductor package that can efficiently dissipate heat using the heat dissipating pad 50a disposed below an electronic device with an area ratio of 35.5% or less, the heat dissipating pad is disposed within a range in which a ratio D/P of the diameter D of the heat dissipating pad 50a with respect to the pitch P is 67 or more.

In the semiconductor package 100 according to an example described above, the heat dissipating conductor 48a is connected to the inactive surface of the electronic device 1, a heat generating device. Thus, heat generated by the electronic device 1 is efficiently dissipated.

When heat generated by the electronic device 1 is not efficiently and/or smoothly dissipated, heat is transferred along an electrical path of the electronic device 1 resulting in an increase in the temperature of the electrical path. In this case, due to heat, resistance in the electrical path increases, which results in an increase in the electrical loss.

However, the disclosed semiconductor package 100 includes the heat dissipating conductor 48a that forms a heat emission path at the shorted distance between the inactive surface of the electronic device 1 and the main substrate MB. Thus, heat generated by the electronic device 1 may be efficiently emitted.

Next, a method of manufacturing a semiconductor package will be described.

FIGS. 3 through 6 are views illustrating a method of manufacturing the semiconductor package of FIG. 1.

Referring to this, in a method of manufacturing a semiconductor package according to an example, a core layer 10 is manufactured first.

Figure 3:
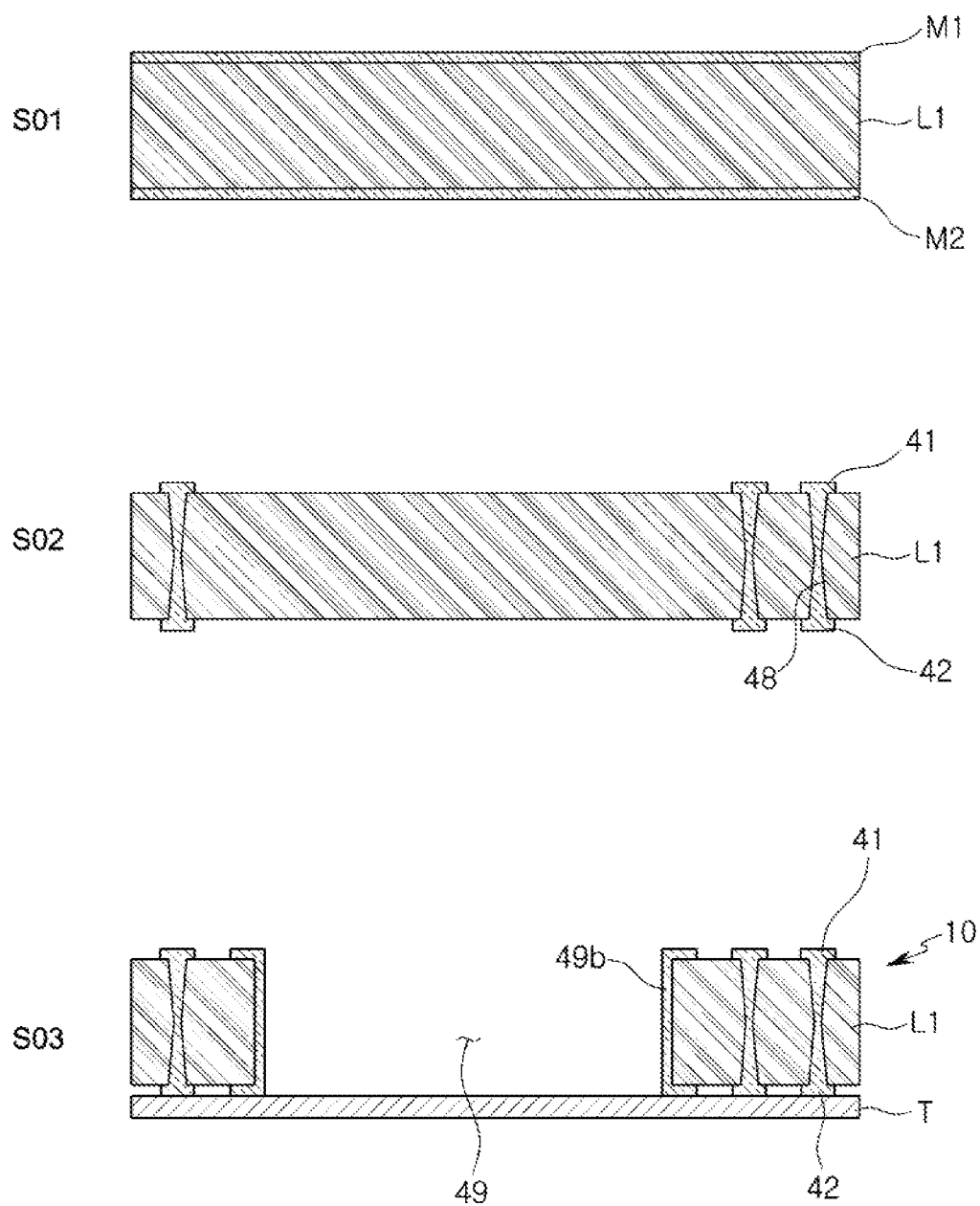
FIGS. 3 through 6 are views illustrating a method of manufacturing the semiconductor package of FIG. 1.

First, as illustrated in FIG. 3, a laminate in which metal layers M1 and M2 are formed in an upper surface and a lower surface of the insulating layer L1 is prepared (S01). For example, a copper clad laminate (CCL) may be used as the laminate.

Next, the metal layers M1 and M2 of the laminate are patterned so as to form distribution layers 41 and 42 (S02) using an exposure process like etching process, or the like.

At the same time, portions of the metal layers M1 and M2 are removed. In the forming the distribution layers 41 and 42, regions from which portions of the metal layers M1 and M2 are removed ultimately define a device accommodating portion 49. Thus, the metal layers M1 and M2 are removed in an area corresponding to a size and a shape of the device accommodating portion 49.

In addition, in the forming the distribution layers 41 and 42 described above, an interlayer connection conductor 48 is formed in the insulating layer L1. The interlayer connection conductor 48 is formed as a via hole in the insulating layer L1, and a conductive material is filled or applied to the interior of the via hole.

While the core layer 10 is manufactured using the same laminate used in the metal layers M1 and M2 on upper and lower surfaces of the insulating layer L1 as described above, the material is not limited thereto. Various modifications are possible. For example, a plurality of insulating layers, in which a distribution pattern is formed, are stacked to define the core layer 10.

Next, after the device accommodating portion 49 is formed by removing a portion of the insulating layer L1, a tape T for supporting the electronic device 1 is attached to a first surface of the core layer 10 (S03).

The device accommodating portion 49 is formed of a through hole in an area corresponding to a size and a shape of the electronic device 1 embedded therein.

A distribution layer is not disposed in the region in which the device accommodating portion 49 is to be formed. Thus, the device accommodating portion 49 is easily formed by removing portions of the insulating layer using a laser or a process capable of removing the insulating layer. In one example, as long as the device accommodating portion 49 is formed in the core layer 10, various methods of removing the insulating layer such as perforation or drilling methods, or the like, may be used.

A shielding layer 49b is formed in an inner side wall of the device accommodating portion 49 as required. The shielding layer 49b is formed of a conductive material, for example, one or both of Cu and Ni, or alloys containing one thereof.

The shielding layer 49b is electrically connected to a ground electrode (not shown), and thus shields noise such as electromagnetic interference (EMI) waves from flowing into or out of the electronic device. In addition, heat generated by the electronic device is transferred to a distribution layer through the shielding layer 49b, improving the heat emission efficiency.

Figure 4:
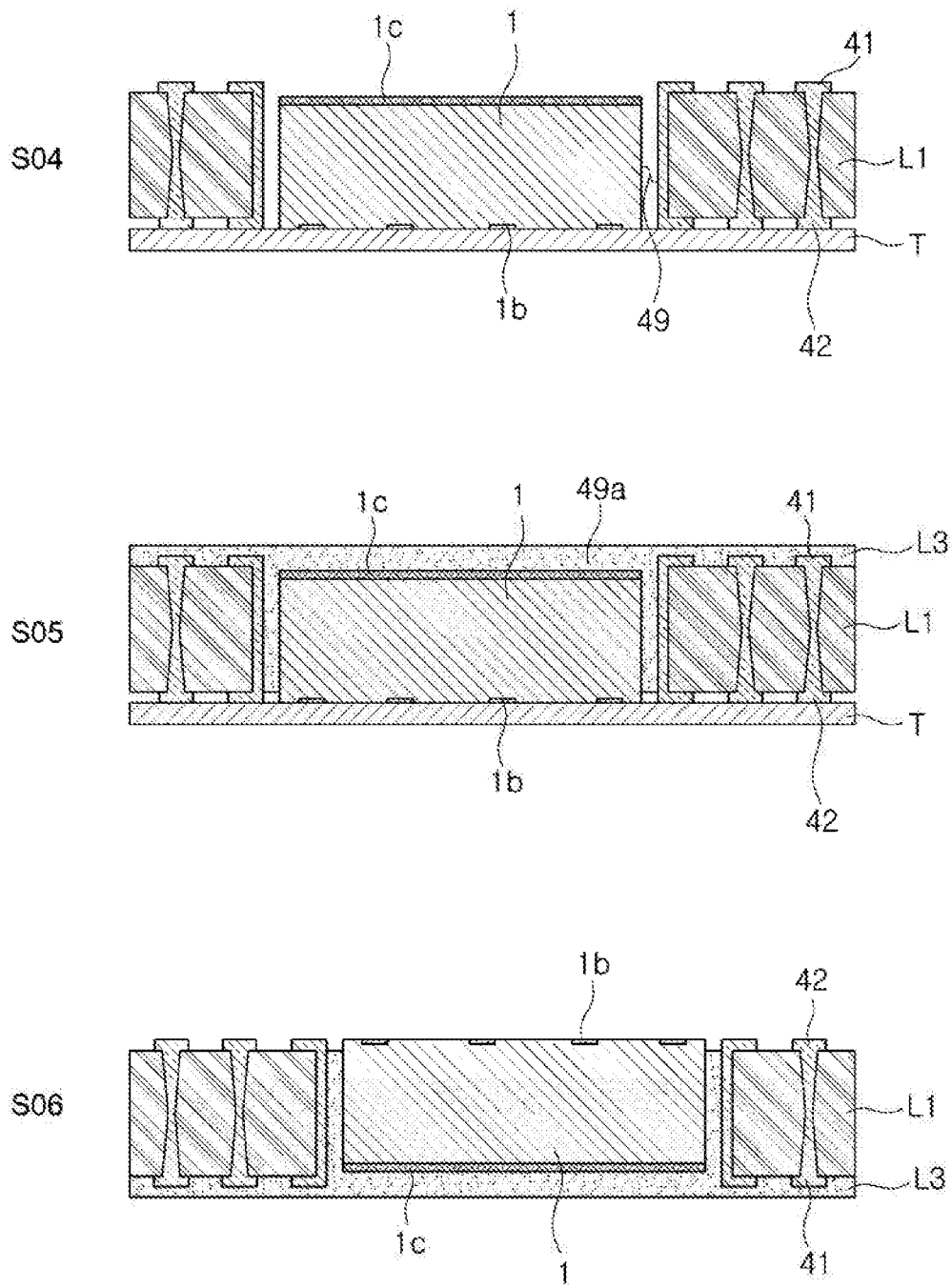

Next, as illustrated in FIG. 4, the electronic device 1 is disposed in the device accommodating portion 49 (S04). In this case, in the electronic device 1, an active surface in which the terminal 1a is formed is attached to the tape T, and the active surface of the electronic device 1 is disposed on the same plane as a first surface of the core layer 10.

When the electronic device 1 is disposed in the device accommodating portion 49, the interior of the device accommodating portion 49 is filled with the insulating member 49a, and then cured (S05). The insulating member 49a flows in the device accommodating portion 49, fills a space formed around the electronic device 1, and fixes the electronic device 1.

The insulating member 49a is formed to cover not only the electronic device 1 but also a second surface of the core layer 10. In this case, the insulating member 49a formed in the core layer 10 is used as an insulating layer L3 of a second redistribution layer (20b of FIG. 1). Thus, the insulating member 49a formed in the second surface of the core layer 10 has a thickness corresponding to that of the insulating layer L3 of the second redistribution layer 20b.

The insulating member 49a flows in the device accommodating portion 49, in the form of liquid or gel, and then is cured and formed, but the example is not limited thereto.

When the insulating member 49a is completely cured, the tape T is removed (S06). Next, a buildup layer (20 of FIG. 1) is provided.

Figure 5:
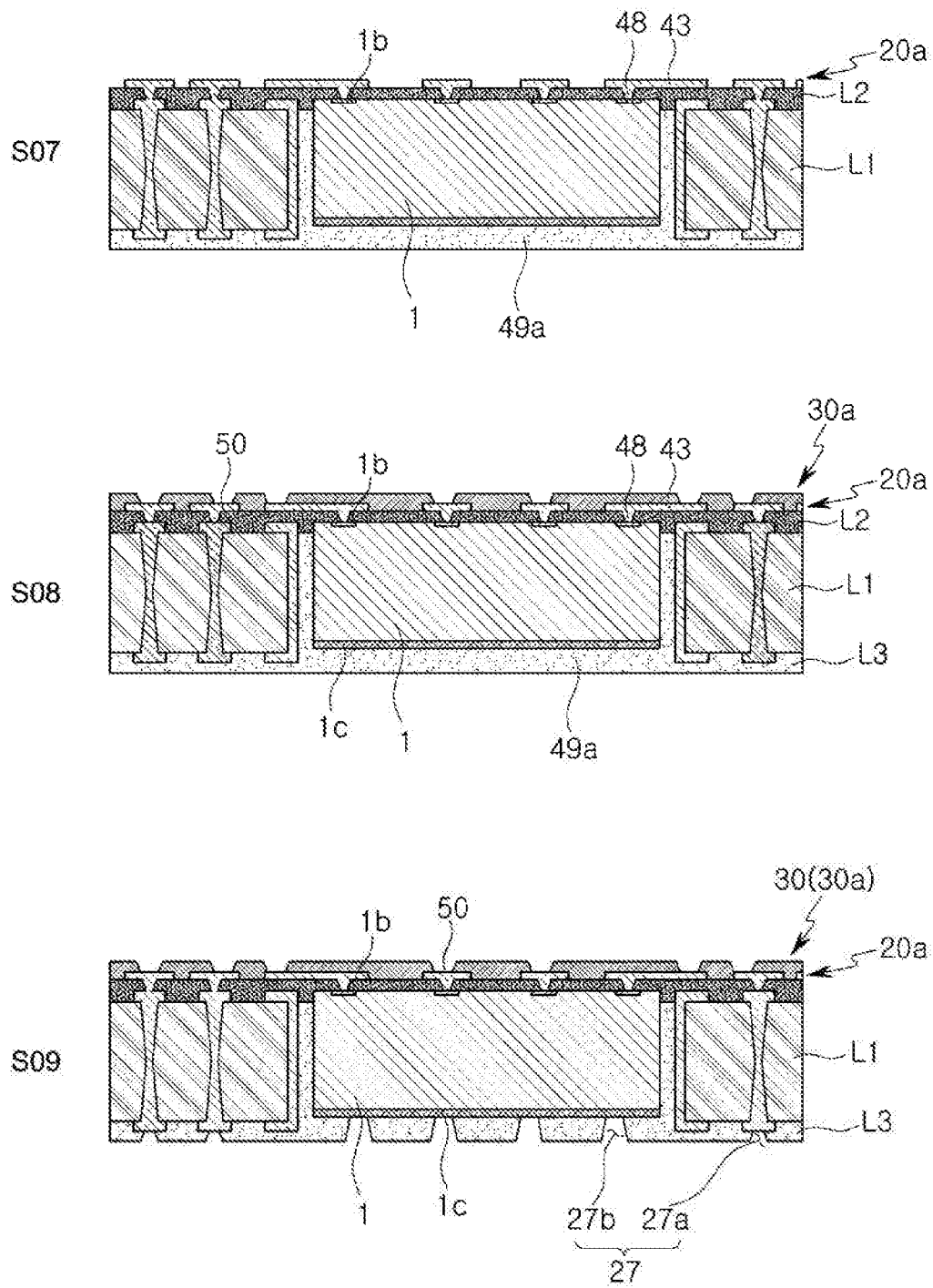

Referring to FIG. 5, first, the first redistribution layer 20a is formed in the active surface of the electronic device 1 and the first surface of the core layer 10 (S07). The first redistribution layer 20a is provided as the insulating layer L2 is formed in the active surface of the electronic device 1. The distribution layer 43 is formed in the insulating layer L2 using a photolithography process. In this case, a plurality of interlayer connection conductors 48 connected to the terminals 1a of the electronic device 1 are formed in the insulating layer L2.

Next, after the first insulating protective layer 30a is formed in the first redistribution layer 20a, a plurality of openings are formed in the first insulating protective layer 30a, thereby externally exposing connection pads 50 (S08). The first insulating protective layer 30a is formed of an insulating material such as a solder resist or an epoxy resin.

In addition, as required, the first insulating protective layer 30a may be formed as a multilayer structure.

In the example, a case in which the first redistribution layer 20a is provided in advance is illustrated but the example is not limited thereto. As required, a second redistribution layer (20b of FIG. 1) may also be provided in advance.

Next, the second redistribution layer (20b of FIG. 1) is provided.

First, a via hole 27 for forming the interlayer connection conductor 48 is formed in the insulating layer L3 through the insulating member 49a (S09).

The interlayer connection conductor 48 is formed using a photolithography method. Thus, in S9, the via hole 27 is formed in the insulating layer L3 using an exposure process and an etching process.

The interlayer connection conductor 48 formed in the second redistribution layer 20b includes a conductor for signal transmission and the heat dissipating conductor 48a. Thus, a plurality of via holes 27 formed in S9 may be formed to have different sizes depending on usage. In one example, a via hole 27b for forming the heat dissipating conductor 48a is formed to be larger than a via hole 27a for forming the conductor for signal transmission.

In addition, the via hole 27b for forming the heat dissipating conductor 48a is formed in a position opposing the electronic device 1, but the example is not limited thereto.

Figure 6:
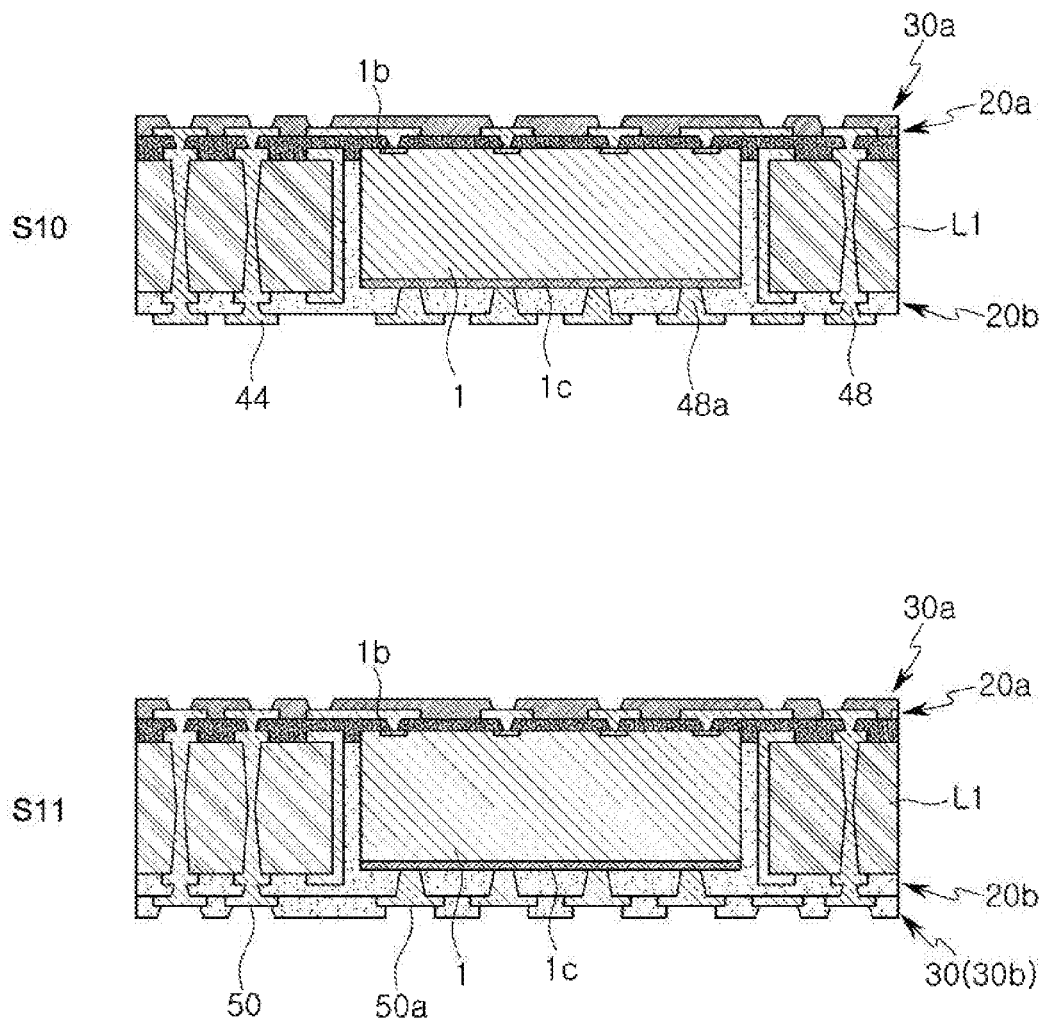

Next, referring to FIG. 6, an interior of the via hole 27 is filled with a conductive material using a plating process, thereby forming the interlayer connection conductor 48, the heat dissipating conductor 48a, and the distribution layer 44 to complete the second redistribution layer 20b (S10).

Next, after the insulating protective layer 30b is formed in the second redistribution layer 20b, a plurality of openings are formed in the second insulating protective layer 30b, so the connection pads 50 and the heat dissipating pads 50a are externally exposed (S11). The second insulating protective layer 30b may be provided as a plurality of layers, as required.

The second insulating protective layer 30b is formed of an insulating material such as a solder resist or an epoxy resin. In one example, the second insulating protective layer 30b formed in the second redistribution layer 20b is formed of the same material as the insulating member 49a, but is not limited thereto.

In the example, a case in which the buildup layer 20 is formed by stacking only a single layer on each of both sides of the core layer 10 is shown but the example is not limited thereto. For example, a plurality of insulating layers may be stacked on the core layer 10, and a distribution layer may be formed therebetween forming the first redistribution layer and the second redistribution layer as a multilayer structure.

Next, the external connection terminal 60 is formed in the electrode pad 50 to complete the semiconductor package 100 illustrated in FIG. 1.

In the method of manufacturing the semiconductor package described above, a core layer is provided as a wide panel to increase the production rate.

In more detail, a plurality of device accommodating portions are formed in a core layer in the form of a panel, and an electronic device is disposed in each of the device accommodating portions to manufacture the plurality of semiconductor package in batches. Thereafter, a plurality of semiconductor packages are completed using a sawing or dicing process.

The semiconductor package is not limited to the example described previously, and various modifications are possible.

Figure 9:
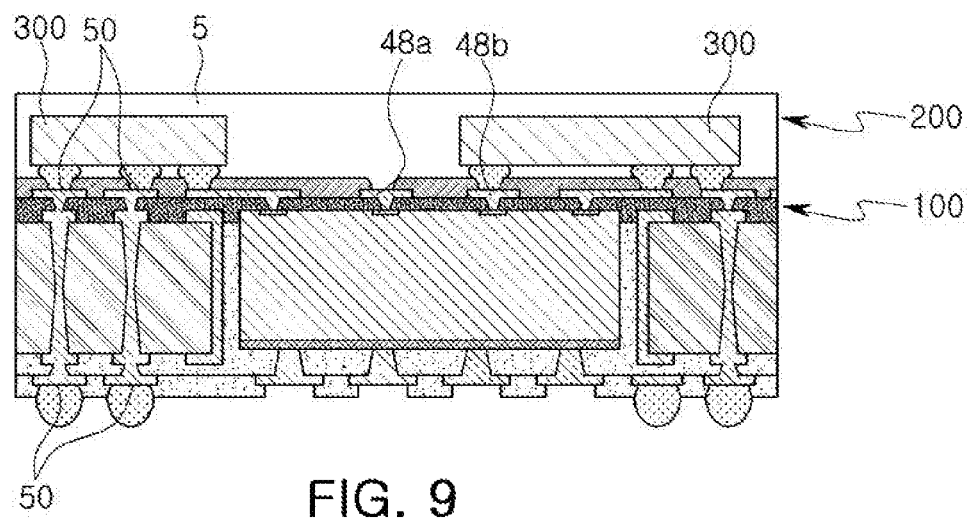
FIG. 9 is a cross-sectional view schematically illustrating another example of a semiconductor package.

FIG. 9 is a cross-sectional view schematically illustrating another example of a semiconductor package.

Referring to FIG. 9, at least one electronic component 300 is mounted on the semiconductor package 100 (hereinafter, a first package) illustrated in FIG. 1 described previously. In addition, the electronic component 300 is configured to be sealed by a sealing portion 5.

In the first package 100, the connection pad 50 is disposed on each of both sides. Thus, a second surface of both sides is provided to mount the first package on a main substrate, and a first surface is provided to mount the electronic component 300, separately manufactured, thereon.

The electronic component 300 may be an active or inactive device. In addition, the sealing portion 5 may be an epoxy molding compound (EMC).

In the first package 100, the connection pad 50 is disposed on the entirety of the first surface. Thus, a relatively large number of connection pads 50 are provided through the first surface to mount a plurality of electronic components 300, thereby increasing the degree of integration.

Figure 10:
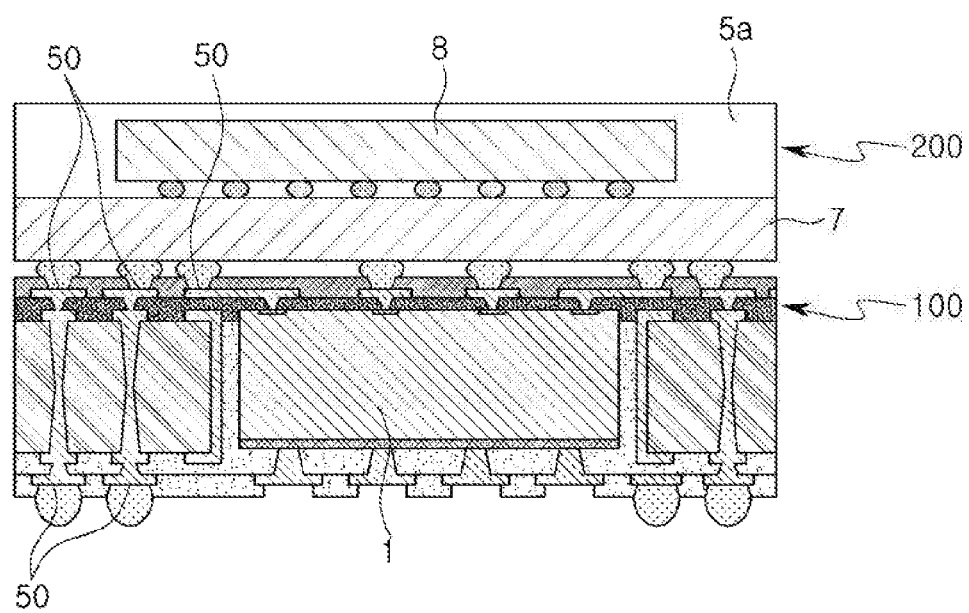
FIG. 10 is a cross-sectional view schematically illustrating another example of a semiconductor package.

FIG. 10 is a cross-sectional view schematically illustrating another example of a semiconductor package.

Referring to FIG. 10, a semiconductor package is provided to have a package on package (PoP) structure in which another semiconductor package 200 (hereinafter, a second package) is mounted on the semiconductor package 100 (hereinafter, a first package) illustrated in FIG. 1.

In the first package 100, the connection pad 50 is disposed on each of both sides. Thus, a first surface of the both sides is provided to mount the first package on a main substrate, and a second surface is provided to mount an electronic component, such as the second package 200, or an inactive device thereon.

The second package 200 may be one of known semiconductor packages.

In one example, the second package 200 is configured to allow the electronic device 8 to be mounted on a substrate 7, and to allow the electronic device 8 to be sealed by a sealing portion 5a. The second package is any electronic component that can be mounted on the first surface of the first package 100, such as a heat dissipation member, or the like.

In the first package 100, the connection pad 50 is disposed on the entirety of the first surface. Thus, a relatively large number of connection pads 50 are provided through the first surface, so a package having a large number of I/O terminals can be mounted on the first surface. In addition, the bond reliability between the second package 200 and the first surface is also increased.

Figure 11:
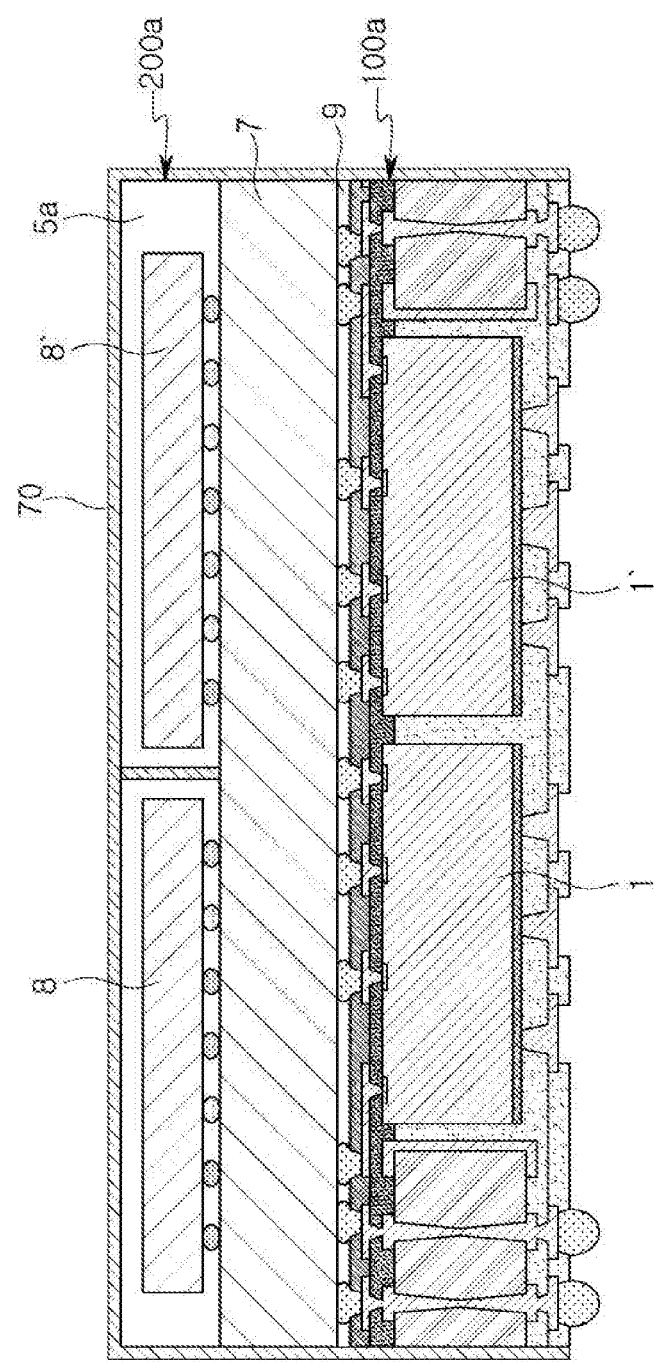
FIG. 11 is a cross-sectional view schematically illustrating another example of a semiconductor package.

FIG. 11 is a cross-sectional view schematically illustrating another example of a semiconductor package.

Referring to FIG. 11, a semiconductor package according to an example is provided to have a package on package (PoP) structure in which a second package 200a is mounted on a first package 100a, a modification of the semiconductor package illustrated in FIG. 1.

FIG. 11 differs from FIG. 1 in that a plurality of electronic devices 1 and 1' are included in the first package 100a, but other configurations are the same as the semiconductor package illustrated in FIG. 1. Each of the electronic devices 1 and 1' may include a power amplifier, a filter, or an integrated circuit (IC), and may be embedded in the form of a bare die as described previously.

The second package 200a may be any known semiconductor package.

In one example, the second package 200a is configured to allow electronic devices 8 and 8' to be mounted on a circuit board 7, and to allow the electronic devices 8 and 8' to be sealed by the sealing portion 5a, but an example is not limited thereto.

In addition, a metal layer 70 is disposed on a surface of a semiconductor package according to an example.

The metal layer 70 is provided to shield electromagnetic waves. Thus, the metal layer 70 is formed along a surface, formed by the second package 200a and the first package 100a. In this case, a gap between the second package 200a and the first package 100a is filled with an insulating material 9.

The metal layer 70, according to the example, is not limited to the configuration described above, and may be only formed on a surface of one of the second package 200a and the first package 100a, as required. In addition, the metal layer 70 is interposed between electronic devices provided in the second package 200a, and thus blocks interference between the electronic devices.

In the semiconductor package configured as described above, the electronic devices 1 and 1' in a bare die state are embedded therein, and the connection pads 50 are disposed in both sides.

Thus, a semiconductor package having a PoP structure can be significantly reduced in size.

In addition, heat generated by the electronic device is efficiently emitted through the heat dissipating conductor, so as to reduce the temperature of the semiconductor package during an operation.

Figure 12:
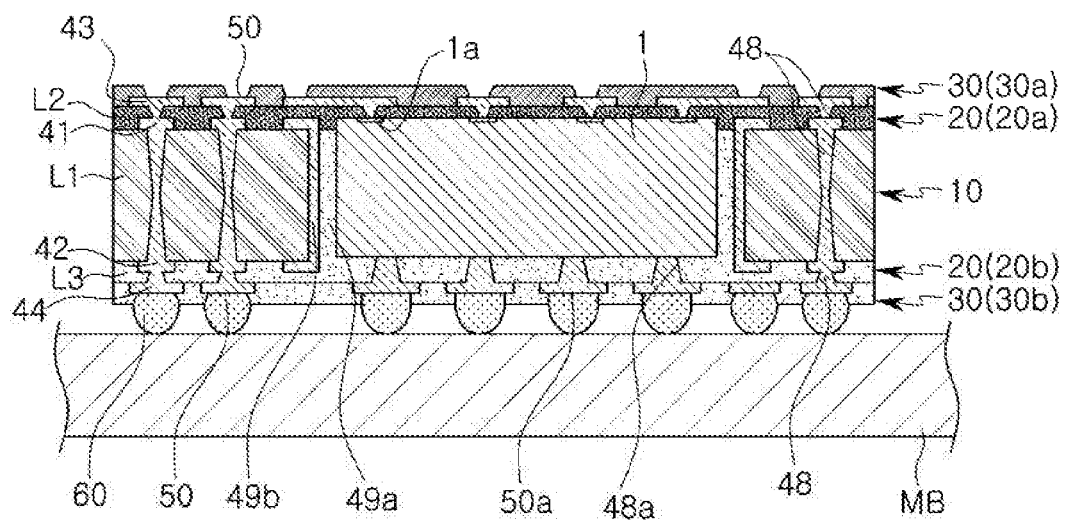
FIG. 12 is a cross-sectional view schematically illustrating another example of a semiconductor package.

FIG. 12 is a cross-sectional view schematically illustrating another example of a semiconductor package.

Referring to FIG. 12, a semiconductor package is configured similar to the semiconductor package (100 of FIG. 1) illustrated in FIG. 1 but there is a difference in that a conductor layer (1c of FIG. 1) is not provided in an inactive surface of an electronic device.

As described above, the semiconductor package may be applied to various structures of an electronic device.

As set forth above, according to examples, in a semiconductor package, an electronic device in a bare die state is embedded therein, and connection terminals are disposed in both sides. Thus, while a size of a semiconductor package is significantly reduced, a semiconductor package may be used for a package on package (PoP) structure.

In addition, heat generated by an electronic device is efficiently dissipated through a heat dissipating conductor, so a temperature of a semiconductor package may be prevented from being increased during an operation.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for the purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor package, comprising:
a substrate portion comprising a core layer having a device accommodating portion formed therein, and a buildup layer formed on each of opposing sides of the core layer;
heat dissipating conductors, comprising heat dissipating pads, disposed in the buildup layer;
an electronic device disposed in the device accommodating portion above the heat dissipating conductors; and
a conductor layer disposed on an inactive surface of the electronic device,
wherein plural heat dissipating conductors of the heat dissipating conductors abut the conductor layer,
the heat dissipating conductors externally emit heat generated by the electronic device and each of the heat dissipating conductors has a distal end connected to the electronic device, and
the heat dissipating conductors are formed to allow a ratio D/P to be 67 or more, where D is a diameter of a heat dissipating pad of the heat dissipating pads and P is a separation distance between the heat dissipating pads.

2. A semiconductor package, comprising:
a substrate portion comprising a core layer having a device accommodating portion formed therein, and a buildup layer stacked on each of opposing sides of the core layer;
heat dissipating conductors disposed in the buildup layer; and
an electronic device disposed in the device accommodating portion above the heat dissipating conductors,
wherein the heat dissipating conductors externally emit heat generated by the electronic device and each of the heat dissipating conductors has a distal end connected to the electronic device,
the heat dissipating conductors comprise heat dissipating pads, and
the heat dissipating conductors are formed to allow a ratio D/P to be 67 or more, where D is a diameter of a heat dissipating pad of the heat dissipating pads and P is a separation distance between the heat dissipating pads.

3. The semiconductor package of claim 2, wherein the electronic device has an active surface having a terminal formed therein and an inactive surface opposite to the active surface, and one of the heat dissipating conductors is connected to the inactive surface.

4. The semiconductor package of claim 3, wherein one of the heat dissipating conductors is disposed opposite to the inactive surface of the electronic device.

5. The semiconductor package of claim 2, further comprising:
an insulating protective layer disposed in the buildup layer,
wherein the insulating protective layer comprises openings partially exposing the heat dissipating conductors.

6. The semiconductor package of claim 5, wherein the heat dissipating pads are formed on a region externally exposed through the insulating protective layer, and
a total area of the heat dissipating pads is 35.5% or less of an area of the inactive surface of the electronic device.

7. The semiconductor package of claim 2, wherein the heat dissipating conductors are disposed in a lattice form.

8. The semiconductor package of claim 2, wherein a heat dissipating conductor of the heat dissipating conductors is disposed to pass through an insulating layer forming the buildup layer, one end of the heat dissipating conductor is connected to the electronic device, and the other end thereof is externally exposed through the buildup layer.

9. The semiconductor package of claim 2, wherein the electronic device is disposed in the device accommodating portion in a bare die state.

10. The semiconductor package of claim 2, wherein the distal end of each of the heat dissipating conductors abuts a surface of the electronic device.

11. A semiconductor package, comprising:
- a substrate portion comprising a core layer having a device accommodating portion formed therein, and a buildup layer stacked on each of opposing sides of the core layer;
- heat dissipating conductors disposed in the buildup layer; and
- a conductor layer disposed on an inactive surface of an electronic device disposed in the device accommodating portion,
- wherein plural heat dissipating conductors of the heat dissipating conductors abut the conductor layer, and the heat dissipating conductors externally emit heat generated by the electronic device,
- each of the heat dissipating conductors has a distal end connected to the electronic device,
- the heat dissipating conductors comprise heat dissipating pads, and
- the heat dissipating conductors are formed to allow a ratio D/P to be 67 or more, where D is a diameter of a heat dissipating pad of the heat dissipating pads and P is a separation distance between the heat dissipating pads.

12. The semiconductor package of claim 10, wherein the surface of the electronic device is an inactive surface.

13. The semiconductor package of claim 11, further comprising:
- an insulating protective layer disposed in the buildup layer,
  - wherein the insulating protective layer comprises openings partially exposing the heat dissipating conductors.

14. The semiconductor package of claim 11, wherein a distal end of each of the heat dissipating conductors abuts the conductor layer.

* * * * *